United States Patent
Fang et al.

(10) Patent No.: US 12,148,896 B2
(45) Date of Patent: Nov. 19, 2024

(54) SOLID ELECTROLYTE THREE ELECTRODE ELECTROCHEMICAL TEST DEVICE

(71) Applicants: Tsinghua University, Beijing (CN); HON HAI PRECISION INDUSTRY CO., LTD., New Taipei (TW)

(72) Inventors: Zhen-Han Fang, Beijing (CN); Jia-Ping Wang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 542 days.

(21) Appl. No.: 17/550,163

(22) Filed: Dec. 14, 2021

(65) Prior Publication Data
US 2022/0399582 A1    Dec. 15, 2022

(30) Foreign Application Priority Data
Jun. 11, 2021    (CN) .......................... 202121311956.5

(51) Int. Cl.
*H01M 10/42*    (2006.01)
*G01N 27/406*    (2006.01)
*G01R 31/36*    (2020.01)

(52) U.S. Cl.
CPC ...... *H01M 10/4285* (2013.01); *G01N 27/406* (2013.01); *G01R 31/3644* (2013.01); *H01M 2300/0065* (2013.01)

(58) Field of Classification Search
CPC ...... H01M 10/4285; H01M 2300/0065; G01N 27/406; G01N 27/4062; G01R 31/3644
See application file for complete search history.

(56) References Cited

U.S. PATENT DOCUMENTS

| | | | |
|---|---|---|---|
| 5,338,429 A | * | 8/1994 | Jolson ................ G01N 27/4045 204/415 |
| 9,874,540 B2 | * | 1/2018 | Westmarland ....... G01N 27/404 |

* cited by examiner

*Primary Examiner* — Alexander S Noguerola
(74) *Attorney, Agent, or Firm* — ScienBiziP, P.C.

(57) ABSTRACT

A solid electrolyte three-electrode electrochemical test device comprises a housing, a working electrode, a counter electrode, a reference electrode, a first conductive structure, a second conductive structure, a third conductive structure, and a solid electrolyte layer. The housing comprises a groove and a first through hole located at a bottom of the groove. The reference electrode is insulated from the counter electrode. The first conductive structure and the working electrode are stacked with each other, and the working electrode and at least a part of the first conductive structure are located in the first through hole. The solid electrolyte layer, the counter electrode, the reference electrode, the second conductive structure and the third conductive structure are located in the groove, and the first conductive structure, the working electrode, the solid electrolyte layer, the counter electrode, and the second conductive structure are sequentially stacked and located coaxially with each other.

15 Claims, 7 Drawing Sheets

SOLID ELECTROLYTE THREE ELECTRODE ELECTROCHEMICAL TEST DEVICE

CROSS-REFERENCE TO RELATED APPLICATIONS

This application claims all benefits accruing under 35 U.S.C. § 119 from Chinese Patent Application No. 202121311956.5, filed on Jun. 11, 2021, in the China National Intellectual Property Administration, the contents of which are hereby incorporated by reference.

FIELD

The present disclosure relates to a solid electrolyte three-electrode electrochemical test device.

BACKGROUND

A solid electrolyte is expected to greatly increase an energy density of batteries, but due to a special properties of its powder, a pressure is required to perform normal operation. Therefore, a two-electrode electrochemical test device is generally used to pressurize and test the solid electrolyte conventionally. A two-electrode system includes a positive electrode (working electrode) and a negative electrode (counter electrode and reference electrode). In real life charging and discharging, or a electrochemical test process, a potential of the counter electrode will change, and a potential of the reference electrode will also change accordingly. Studies of accuracies of electrochemical tests of the solid electrolyte such as electrochemical window measurement may be hindered. At the same time, the two-electrode system cannot obtain information such as the potential and current between the reference electrode and the counter electrode in the test. Therefore, there is an urgent need for a solid electrolyte electrochemical test device that can accurately and efficiently detect various data on the solid electrolyte simultaneously.

BRIEF DESCRIPTION OF THE DRAWINGS

Implementations of the present technology will now be described, by way of example only, with reference to the attached figures.

DETAILED DESCRIPTION

Figure 1:
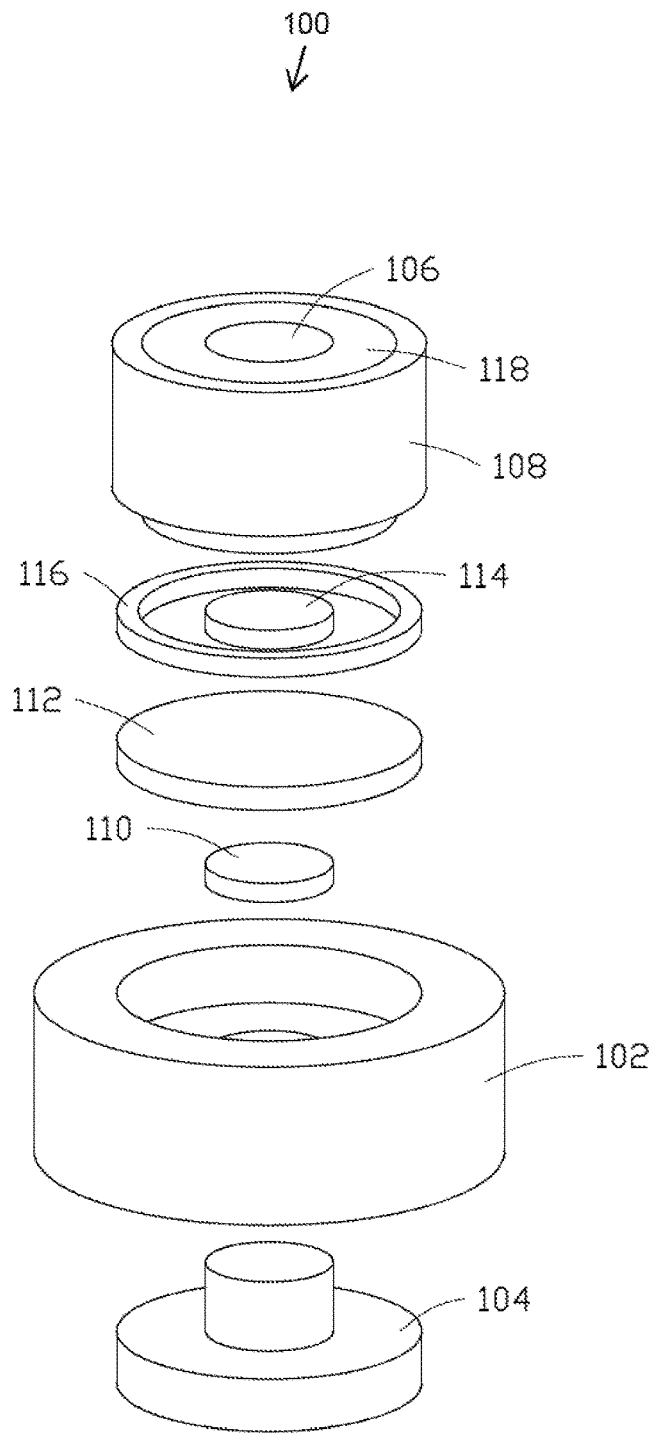
FIG. 1 is a view of one embodiment of a solid electrolyte three-electrode electrochemical test device according to the present disclosure.
Figure 2:
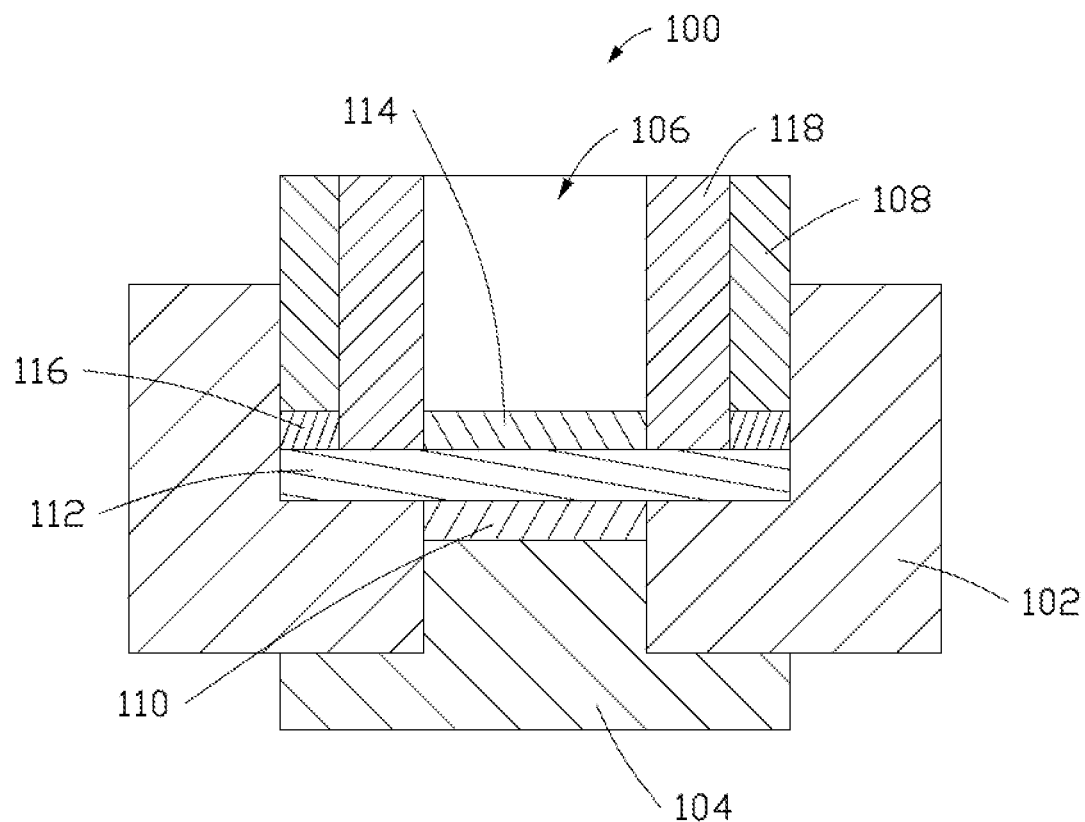
FIG. 2 is a schematic cross-sectional view of the solid electrolyte three-electrode electrochemical test device of FIG. 1.
Figure 3:
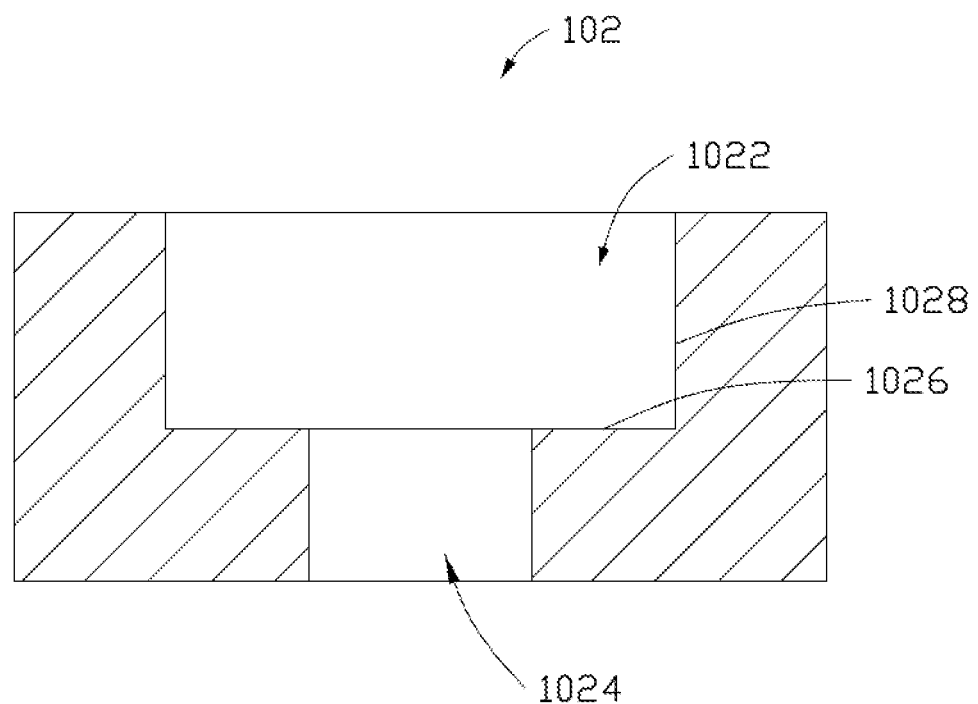
FIG. 3 is a cross-section view of a housing of the solid electrolyte three-electrode electrochemical test device of FIG. 1.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one".

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts can be exaggerated to illustrate details and features of the present disclosure better.

Several definitions that apply throughout this disclosure will now be presented.

The term "comprise" or "comprising" when utilized, means "include or including, but not necessarily limited to"; it specifically indicates open-ended inclusion or membership in the so-described combination, group, series, and the like.

Referring to FIG. 1, a solid electrolyte three-electrode electrochemical test device 100 is provided in one embodiment. The solid electrolyte three-electrode electrochemical test device 100 comprises a housing 102, a first conductive structure 104, a second conductive structure 106, a third conductive structure 108, a working electrode 110, a solid electrolyte layer 112, a counter electrode 114 and a reference electrode 116. The housing 102 comprises a groove 1022 and a first through hole 1024 located at a bottom of the groove 1022. The first conductive structure 104 and the working electrode 110 are stacked with each other, and the working electrode 110 and at least a part of the first conductive structure 104 are located in the first through hole 1024. The solid electrolyte layer 112, the counter electrode 114, the reference electrode 116, the second conductive structure 106 and the third conductive structure 108 are located in the groove 1022. The first conductive structure 104, the working electrode 110, the solid electrolyte layer 112, the counter electrode 114, and the second conductive structure 106 are sequentially stacked and located coaxially with each other. The counter electrode 114 is insulated from the reference electrode 116. The third conductive structure 108 is stacked with the reference electrode 116 and insulated from the second conductive structure 106.

The housing 102 comprises the groove 1022 and the first through hole 1024 at the bottom of the groove 1022. The solid electrolyte layer 112, the counter electrode 114, the reference electrode 116, the second conductive structure 106, the third conductive structure 108 and the insulating structure 118 are located in the groove 1022. A shape and size of the groove 1022 are not limited, and can be selected according to actual needs. The shape of the groove 1022 can be a circle, a square, or other regular or irregular patterns. In one embodiment, a cross-sectional shape of the groove 1022 is a circle with a diameter of 20 mm. The first conductive structure 104 and the working electrode 110 are located in the first through hole 1024. A shape and size of the first through hole 1024 are not limited, and can be selected according to actual needs. The shape of the first through hole 1024 can be a circle, a square, or other regular or irregular patterns. In one embodiment, a cross-sectional shape of the first through hole 1024 is a circle with a diameter of 10 mm. A length of the first through hole 1024 in an axial direction is not limited, and can be selected according to actual needs. The length of the first through hole 1024 in the axial direction is ranged from about 5 mm to about 20 mm. In one embodiment, the length of the first through hole 1024 in the axial direction is 5 mm. A material of the housing 102 is an insulating material. The material of the housing 102 is a pressure-resistant insulating material, such as polyether ether ketone, polycarbonate, polytetrafluoroethylene, polyacrylate, rubber materials, resin materials, alumina, zirconia, mica, boron nitride or ceramic materials, etc. In one embodiment, the material of the housing 102 is polyether ether ketone.

Figure 4:
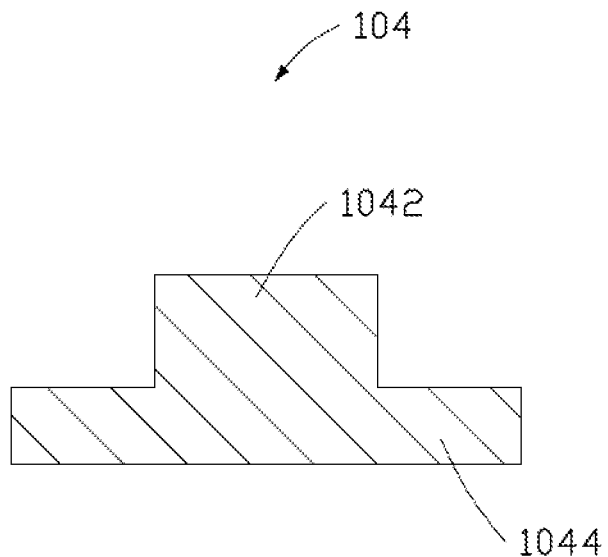
FIG. 4 is a cross-sectional view of a first conductive structure of the solid electrolyte three-electrode electrochemical test device of FIG. 1.

The first conductive structure 104 can be entirely or partially disposed in the first through hole 1024, as long as it is ensured that the first conductive structure 104 can be connected to an external wire. In one embodiment, the first conductive structure 104 is partially disposed in the first through hole 1024. Referring to FIG. 4, the first conductive structure 104 comprises a first structure 1042 and a second structure 1044, and the first structure 1042 and the second structure 1044 are stacked with each other. The first structure 1042 is located in the first through hole 1024, and the second structure 1044 is located outside the first through hole 1024 and in contact with a bottom of the housing 102. A shape and area of a cross section of the first structure 1042 are respectively consistent with a shape and area of the cross section of the first through hole 1024, so that the first structure 1042 can be disposed in the first through hole 1024. In one embodiment, a cross-sectional shape of the first structure 1042 is circular, and its diameter is 10 mm. Preferably, a cross-sectional area of the second structure 1044 is larger than the cross-sectional area of the first structure 1042, so that the first conductive structure 104 can be located and fixed in the housing 102 through the first structure 1042. A length of the first structure 1042 in an axial direction is smaller than a length of the first through hole 1024 in an axial direction. The length of the first structure 1042 in the axial direction is ranged from about 4 mm to about 19 mm. In one embodiment, the length of the first structure 1042 in the axial direction is 4.5 mm. A material of the first conductive structure 104 is a conductive material. Preferably, the material of the first conductive structure 104 is a pressure-resistant conductive material, for example, stainless steel, brass, steel, or alloy. In one embodiment, the material of the first conductive structure 104 is brass.

The working electrode 110 is a layered structure. The working electrode 110 is located in the first through hole 1024 and stacked with the first conductive structure 104. Specifically, the working electrode 110 comprises a first surface and a second surface opposite to the first surface. The first structure 1042 comprises a third surface. The first surface of the working electrode 110 is in contact with the third surface of the first structure 1042. A shape and area of the cross section of the working electrode 110 are the same as a shape and area of the cross section of the first structure 1042, that is, the first surface is the same as the third surface. In one embodiment, the cross-sectional shape of the working electrode 110 is circular, and its diameter is 10 mm. The second surface of the working electrode 110 and a bottom surface 1026 of the groove are located on a same plane. That is, the sum of the length of the first structure 1042 in the axial direction and the thickness of the working electrode 110 is equal to the length of the first through hole 1024 in the axial direction. The thickness of the working electrode 110 is ranged from about 0.1 mm to about 1 mm. In one embodiment, the thickness of the working electrode 110 is 0.5 mm. The material of the working electrode 110 is a conductive electrode material. The conductive electrode material can be lithium cobaltate, lithium iron phosphate, ternary layered material, graphite, silicon, lithium titanate, metal, carbon nanotube or graphene. The metal may be stainless steel, platinum, gold, or nickel. In one embodiment, the material of the working electrode 110 is stainless steel.

The solid electrolyte layer 112 is located in the groove 1022, the solid electrolyte layer 112 is stacked with and in contact with the working electrode 110. Specifically, the solid electrolyte layer 112 is located on the bottom surface 1026 of the groove 1022 and in contact with the second surface of the working electrode 110. A shape of the solid electrolyte layer 112 is not limited, and can be selected according to actual needs. In one embodiment, a cross-sectional area of the solid electrolyte layer 112 is the same as a area of the bottom surface 1026 of the groove 1022. The solid electrolyte layer 112 can be an inorganic solid electrolyte layer or an organic polymer film. A material of the inorganic solid electrolyte layer is oxide, sulfide, halide or ceramic. The oxide can be a perovskite-type oxide, a garnet-type oxide, a LISICON-type oxide, or a NASICON-type oxide. The perovskite-type oxide can be $Li_{0.34}Nd_{0.55}TiO_3$. The garnet type oxide can be $Li_3Ln_3Ta_2O_{12}$. The LISICON type oxide can be $Li_{14}Zn(GeO_4)_4$. The NASICON type oxide can be $Na_3Zr_2Si_2PO_{12}$. The sulfide can be $Li_{10}GeP_2S_{12}$ (LGPS) or $Li_{10}SnP_2S_{12}$. The halide can be $Li_6PS_5Cl$, $Li_3InCl_6$, $Li_3YCl_6$. A material of the organic polymer film is polyethylene oxide, polyacrylonitrile or polyvinylidene fluoride. In one embodiment, the material of the solid electrolyte layer 112 is $Li_{10}GeP_2S_{12}$ (LGPS).

The counter electrode 114 and the reference electrode 116 both have a layered structure. The counter electrode 114 and the reference electrode 116 are insulated from each other, and are stacked with the solid electrolyte layer 112 respectively. The counter electrode 114 and the reference electrode 116 are located on a surface of the solid electrolyte layer 112 away from the bottom surface 1026 of the groove 1022. The counter electrode 114 and the reference electrode 116 are separated and insulated by the insulating structure 118. The insulating structure 118 is a cylindrical structure. The cylindrical structure has an inner wall and an outer wall. The insulating structure 118 has a second through hole. The second through hole is coaxially located with the first through hole 1024. A shape of the second through hole is not limited and can be set according to actual needs. In one embodiment, a cross-sectional shape of the second through hole is the same as the cross-sectional shape of the first through hole 1024, and a cross-sectional area of the second through hole is the same as the cross-sectional area of the first through hole 1024. The bottom of the insulating structure 118 is in contact with the solid electrolyte layer 112. A material of the insulating structure 118 is an insulating material. In one embodiment, the material of the insulating structure 118 is a pressure-resistant insulating material. The material of the insulating structure 118 can be polyether ether ketone, polycarbonate, polytetrafluoroethylene, polyacrylate, rubber materials, resin materials, alumina, zirconia, Mica, boron nitride or ceramic. In one embodiment, the material of the insulating structure 118 is polyether ether ketone.

The counter electrode 114 is disposed in the second through hole, and an outer wall of the counter electrode 114 is in contact with the inner wall of the insulating structure 118. That is, the insulating structure 118 covers the outer wall of the counter electrode 114. The counter electrode 114 and the working electrode 110 are spaced apart with other by the solid electrolyte layer 112, and the counter electrode 114 and the working electrode 110 are coaxially located with the solid electrolyte layer 112. A cross-sectional shape of the counter electrode 114 is the same as the cross-sectional shape of the working electrode 110, and a cross-sectional area of the counter electrode 114 is the same as the cross-sectional area of the working electrode 110. In one embodiment, the shape of the counter electrode 114 is circular, and its diameter is 10 mm. The reference electrode 116 has a cylindrical structure.

The reference electrode 116 is located between the inner wall 1028 of the groove 1022 and the outer wall of the insulating structure 118. The reference electrode 116 covers a part of the outer wall of the insulating structure 118. Specifically, the reference electrode 116 has an inner wall and an outer wall. The outer wall of the reference electrode 116 is in contact with the inner wall 1028 of the groove 1022, and the inner wall of the reference electrode 116 is in contact with the outer wall of the insulating structure 118. A thickness of the counter electrode 114 and the reference electrode 116 can be selected according to actual needs. The thickness of the counter electrode 114 and the reference electrode 116 is ranged from about 0.1 mm to about 1 mm. In one embodiment, the thickness of the counter electrode 114 and the reference electrode 116 are the same. In one embodiment, the thickness of the counter electrode 114 and the reference electrode 116 is 0.4 mm. A shape and width of the cross section of the reference electrode 116 can be selected according to actual needs. The width of the reference electrode 116 refers to A distance between the inner wall and the outer wall of the reference electrode 116. The width of the reference electrode 116 is ranged form about 1 to about 3 mm. In one embodiment, the reference electrode 116 is a ring structure with a width of 2 mm. Materials of the counter electrode 114 and the reference electrode 116 are conductive electrode materials or electrode active materials. The conductive electrode material can be used as a metal element of a reference, for example, lithium, sodium, zinc, magnesium, or aluminum. The electrode active material can be graphite, silicon, tin, or lithium titanate. In one embodiment, the counter electrode 114 and the reference electrode 116 are lithium sheets.

The second conductive structure 106 is located in the second through hole of the insulating structure 118. The second conductive structure 106 is stacked with and in contact with the surface of the counter electrode 114 away from the solid electrolyte layer 112. At the same time, the second conductive structure 106 and the third conductive structure 108 are insulated by the insulating structure 118. The second conductive structure 106 is coaxially located with the counter electrode 114, the solid electrolyte layer 112, the working electrode 110 and the first conductive structure 104. In one embodiment, the cross-sectional shapes and areas of the second conductive structure 106, the counter electrode 114, the working electrode 110, and the first conductive structure 104 are the same. A material of the second conductive structure 106 is a conductive material. In one embodiment, the material of the second conductive structure 106 is a pressure-resistant conductive material, for example, stainless steel, brass, steel, or alloy. In one embodiment, the material of the second conductive structure 106 is brass.

The third conductive structure 108 is located between the groove 1022 and the insulating structure 118. The third conductive structure 108 is stacked with and in contact with the reference electrode 116, and the third conductive structure 108 is insulated from the second conductive structure 104. A sidewall of the groove 1022 covers the outer surface of the third conductive structure 108. The third conductive structure 108 covers the outer surface of the insulating structure 118. The third conductive structure 108 is a cylindrical structure with a third through hole. The second conductive structure 106, the insulating structure 118, and the counter electrode 114 are located in the third through hole. The third conductive structure 108 has an inner wall and an outer wall. The inner wall of the third conductive structure 108 is in contact with the outer wall of the insulating structure 118. The outer wall of the third conductive structure 108 is in contact with the inner wall 1028 of the groove 1022. The third conductive structure 108 is overlapped with the reference electrode 116. The overlapping means that the cross-sectional shape and area of the third conductive structure 108 are the same as the cross-sectional shape and area of the reference electrode 116. The width of the third conductive structure 108 can be selected according to actual needs. The width of the third conductive structure 108 is a distance between the inner wall and the outer wall of the third conductive structure 108. The width of the third conductive structure 108 is ranged from about 1 mm to about 3 mm. In one embodiment, the cross-sectional shape of the third conductive structure 108 is a ring with a width of 2 mm. A material of the third conductive structure 108 is a conductive material. The material of the third conductive structure 108 can be a pressure-resistant conductive material, for example, stainless steel, brass, steel, or alloy. In one embodiment, the material of the third conductive structure 108 is brass.

The third conductive structure 108, the insulating structure 118 and the second conductive structure 106 are coaxially located with each other. The insulating structure 118 covers the outer surface of the second conductive structure 106, and the third conductive structure 108 covers the outer surface of the insulating structure 118 to form a composite structure. A length of the third conductive structure 108 and a length of the second conductive structure 106 are the same in the axial direction. Since the insulating structure 118 is located between the counter electrode 114 and the reference electrode 116 and used to insulate the counter electrode 114 from the reference electrode 116, the length of the insulating structure 118 is greater than the length of the third conductive structure 108 and the length of the second conductive structure 106 in the axial direction. A surface of the composite structure away from the solid electrolyte layer 112 is a plane. The plane and the top surface of the groove 1022 can be in a same plane or the plane can be higher than the top surface of the groove 1022. In one embodiment, the surface of the composite structure away from the solid electrolyte layer 112 is higher than the top surface of the groove 1022 to make a connection of the third conductive structure 108 with wires.

Further, the first structure 1042 of the first conductive structure 104 can have a first groove surrounding its outer wall. A first sealing ring is located in the first groove. At the same time, the second conductive structure 106 can have a second groove surrounding its outer wall. A second sealing ring is located in the second groove. The first sealing ring is used to seal a gap between the first structure 1042 and the first through hole 1024 of the groove 1022, and the second sealing ring is used to seal a gap between the second conductive structure 106 and the insulating structures 118. Thus, the solid electrolyte three-electrode electrochemical test device 100 can be tested in air.

Further, the solid electrolyte three-electrode electrochemical test device 100 can comprises a mechanical clamp. The mechanical clamp comprises an upper clamping part and a lower clamping part. The solid electrolyte three-electrode electrochemical test device 100 is set between the upper clamping part and the lower clamping part, and a pressure applied to the solid electrolyte layer 112 is adjusted by adjusting a torque wrench on the clamping part to perform electrochemical test.

The solid electrolyte three-electrode electrochemical test device 100 can be assembled through the following steps. The first structure 1042 of the first conductive structure 104 is placed in the first through hole 1024, and the working electrode 110 is located on an exposed surface of the first structure 1042. The solid electrolyte layer 112 is located on the bottom surface 1026 of the groove 1022 and in contact with the working electrode 110. When the material of the solid electrolyte layer 112 is inorganic solid electrolyte powder, the inorganic solid powder can be placed on the bottom surface 1026 of the groove 1022 and then the inorganic solid electrolyte powder can be pressed into the solid electrolyte layer 112 by using a pressing tool. When the solid electrolyte layer 112 is the organic polymer film, the organic polymer film is directly located on the bottom surface 1026 of the groove 1022. The reference electrode 116 is located on a first surface of the solid electrolyte layer 112, and a outer wall of the reference electrode 116 is in contact with the inner wall 1028 of the groove 1022. Further, a cylindrical insulating structure 118 is located on the first surface of the solid electrolyte layer 112 so that an inner wall of the reference electrode 116 is in contact with the outer wall of the insulating structure 118. Then, the counter electrode 114 and the second conductive structure 106 are sequentially located in the second through hole of the insulating structure 118, and the third conductive structure 108 is sleeved outside the insulating structure 118. That is, the third conductive structure 108 is located between the insulating structure 118 and the inner wall 1028 of the groove 1022.

Example 1

The working electrode 110 (cathode) is a stainless steel sheet with a diameter of 10 mm. The solid electrolyte layer 112 is obtained by cold pressing 400 mg of $Li_{10}GeP_2S_{12}$ (LGPS) with a powder tablet machine for 3 minutes. The reference electrode 116 is a lithium ring sheet with an inner diameter of 16 mm and an outer diameter of 20 mm. The counter electrode 114 is a lithium sheet with a diameter of 10 mm. The insulating structure 118 is a hollow polyether ether ketone (PEEK) insulating ring with an inner diameter of 10 mm and an outer diameter of 15 mm. The material of the first conductive structure 104, the second conductive structure 106 and the third conductive structure 108 is copper. The above-mentioned components are assembled into a solid electrolyte three-electrode electrochemical test device 100 according to the above-mentioned assembly method. The solid electrolyte three-electrode electrochemical test device 100 is located between the mechanical clamps and screws on the clamps are tightened so that the battery has a constant pressure during the test.

The solid electrolyte three-electrode electrochemical test device 100 is located in a glove box, an electrochemical window is tested by linear sweep voltammetry (LSV), and potential difference between the counter electrode 114 and the reference electrode 116 are monitored to study the potential change of the counter electrode 114.

Figure 5:
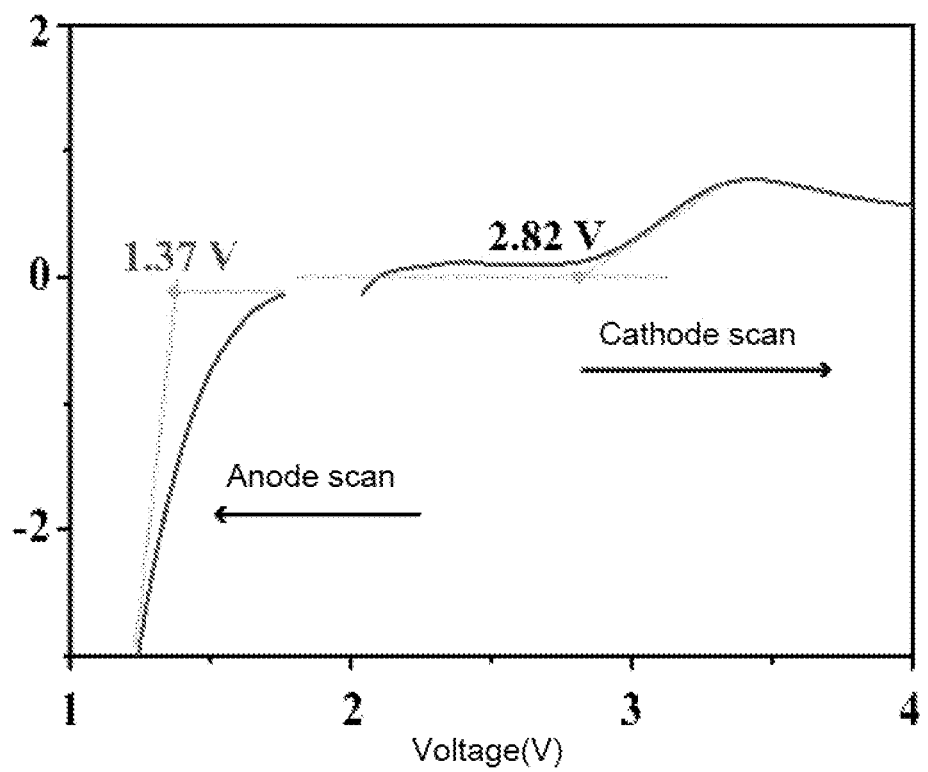
FIG. 5 is a linear sweep graph of a $Li_{10}GeP_2S_{12}$ (LGPS) electrochemical window three-electrode test.
Figure 6:
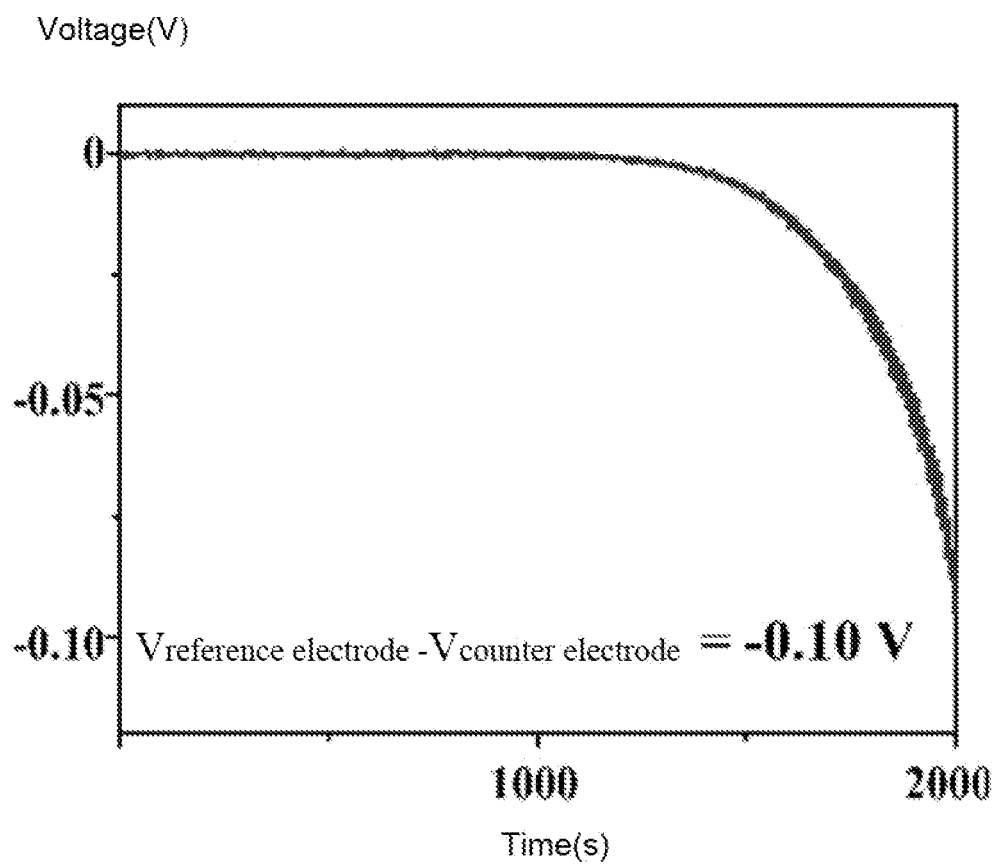
FIG. 6 is a graph showing potential difference and time between the reference electrode and the counter electrode in the three-electrode test of the LGPS reduction potential.
Figure 7:
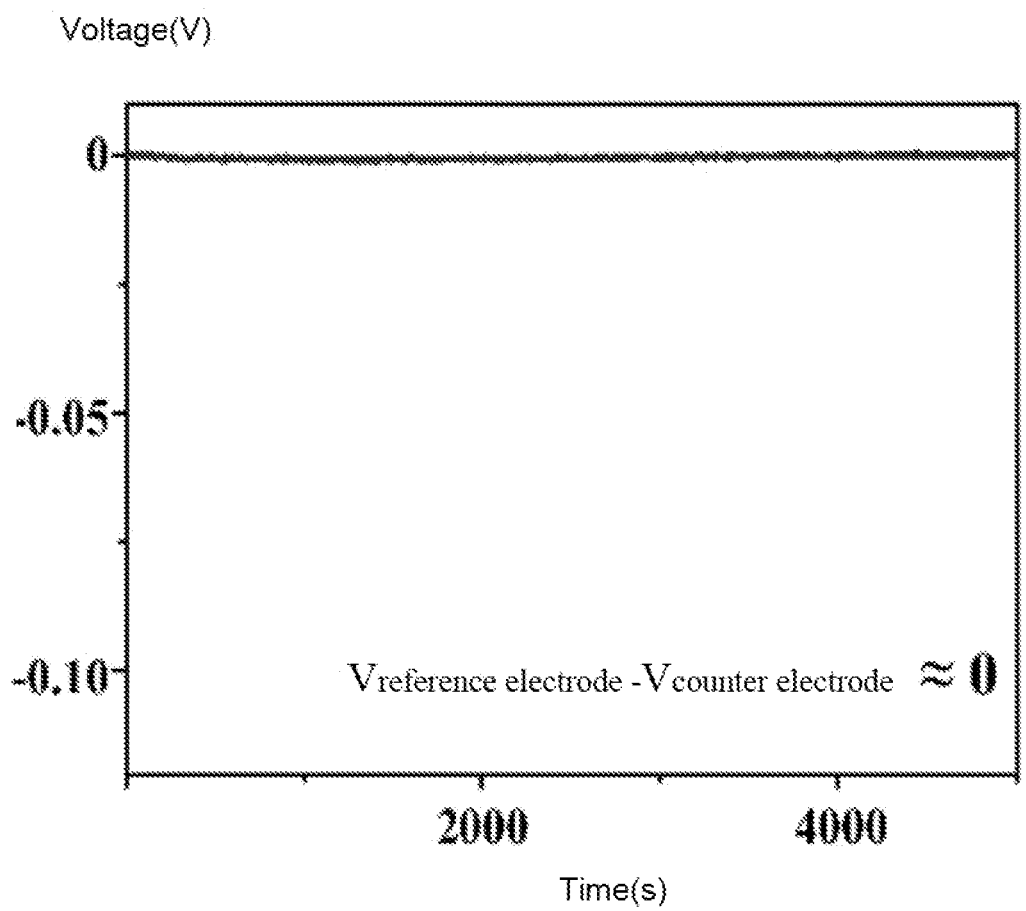
FIG. 7 is a graph showing the potential difference and time between the reference electrode and the counter electrode in the three-electrode test of the LGPS oxidation potential.

As shown in FIG. 5, a reduction peak potential of the cathode is 1.39 V, and an oxidation peak potential of the cathode is 2.82 V. As shown in FIG. 6, the potential difference between the counter electrode 114 and the reference electrode 116 is initially equal, and then the potential of the counter electrode 114 increases, and finally the potential difference between the reference electrode 116 and the counter electrode 114 is −0.1V during anode scanning. As shown in FIG. 7, the potential difference between the counter electrode 114 and the reference electrode 116 is substantially zero throughout during cathodic scanning. This result confirms that the potential of the counter electrode 114 can change with the progress of the reaction. Therefore, the solid electrolyte two-electrode electrochemical test system uses the changed counter electrode potential as a reference, which can lead to deviations in the test results.

It can be seen from the above test diagram that the solid electrolyte three-electrode electrochemical test device 100 introduces an additional reference electrode that does not participate in the charging and discharging process, which can ensure that the reference electrode potential remains unchanged, and a more accurate solid electrolyte electrochemical window test can be obtained. At the same time, the solid electrolyte three-electrode electrochemical test device can also obtain information such as the potential and current between the reference electrode and the counter electrode.

The solid electrolyte three-electrode electrochemical test device 100 has the following beneficial effects: an uniform force of the solid electrolyte is realized through the straight-up and straight-down coaxial structure design, and the solid electrolyte area can be expanded to introduce an independent reference electrode; the three-electrode system is introduced an additional reference electrode that does not participate in the charge and discharge process can keep the reference electrode potential unchanged, and obtain more accurate solid electrolyte electrochemical window test results. In the three-electrode system, there is a polarization current passing through a polarization loop, which can measure and control the reference electrode; in a measurement control loop, a potential of the working electrode is measured and controlled. Since no polarization current flows in the loop, there is only a very small measuring current, so it will not interfere with a polarization state of the working electrode and a stability of the reference electrode. The three-electrode system allows the polarizing current to pass through the surface of the working electrode without hindering the control and measurement of the electrode potential under study. It can realize the control and measurement of the potential and current at the same time. Therefore, the solid electrolyte can be tested in many ways. The experimental data can accurately and efficiently study the electrochemical characteristics of solid electrolytes.

Even though numerous characteristics and advantages of certain inventive embodiments have been set out in the foregoing description, together with details of the structures and functions of the embodiments, the disclosure is illustrative only. Changes can be made in detail, especially in matters of an arrangement of parts, within the principles of the present disclosure to the full extent indicated by the broad general meaning of the terms in which the appended claims are expressed.

Depending on the embodiment, certain of the steps of methods described can be removed, others can be added, and the sequence of steps can be altered. It is also to be understood that the description and the claims drawn to a method can comprise some indication in reference to certain steps. However, the indication used is only to be viewed for identification purposes and not as a suggestion as to an order for the steps.

The embodiments shown and described above are only examples. Even though numerous characteristics and advantages of the present technology have been set forth in the foregoing description, together with details of the structure and function of the present disclosure, the disclosure is illustrative only, and changes can be made in the detail, especially in matters of shape, size and arrangement of the parts within the principles of the present disclosure up to, and including the full extent established by the broad general meaning of the terms used in the claims. It will, therefore, be appreciated that the embodiments described above can be modified within the scope of the claims.

What is claimed is:

1. A solid electrolyte three-electrode electrochemical test device comprising:
   a housing comprising a groove defining a first through hole located at a bottom of the groove;
   a working electrode;
   a counter electrode;
   a reference electrode insulated from the counter electrode;
   a first conductive structure, wherein the first conductive structure and the working electrode are stacked with each other, and the working electrode and at least a part of the first conductive structure are located in the first through hole;
   a second conductive structure;
   a third conductive structure, wherein the third conductive structure is stacked with the reference electrode and insulated from the second conductive structure; and
   a solid electrolyte layer, wherein the solid electrolyte layer, the counter electrode, the reference electrode, the second conductive structure and the third conductive structure are located in the groove, and the first conductive structure, the working electrode, the solid electrolyte layer, the counter electrode, and the second conductive structure are sequentially stacked and located coaxially with each other.

2. The solid electrolyte three-electrode electrochemical test device of claim 1, wherein the first conductive structure comprises a first structure and a second structure stacked with each other, the first structure is located in the first through hole, and the second structure is located outside the first through hole.

3. The solid electrolyte three-electrode electrochemical test device of claim 2, wherein a length of the first structure is smaller than a length of the first through hole in an axial direction.

4. The solid electrolyte three-electrode electrochemical test device of claim 2, wherein a length of the first structure in the axial direction is ranged from 4 mm to 19 mm.

5. The solid electrolyte three-electrode electrochemical test device of claim 2, wherein the working electrode comprises a first surface and a second surface opposite to the first surface, the first surface is in contact with the first structure, and the second surface and a bottom surface of the groove are located on a same plane.

6. The solid electrolyte three-electrode electrochemical test device of claim 1, wherein the solid electrolyte layer is located in the groove, and the solid electrolyte layer is stacked with and in contact with the working electrode.

7. The solid electrolyte three-electrode electrochemical test device of claim 1, wherein the solid electrolyte layer is an inorganic solid electrolyte layer or an organic polymer film.

8. The solid electrolyte three-electrode electrochemical test device of claim 7, wherein a material of the inorganic solid electrolyte layer is oxide, sulfide, halide or ceramic.

9. The solid electrolyte three-electrode electrochemical test device of claim 7, wherein a material of the organic polymer film is polyethylene oxide, polyacrylonitrile or polyvinylidene fluoride.

10. The solid electrolyte three-electrode electrochemical test device of claim 1, further comprising an insulating structure, the counter electrode is insulated from the reference electrode by the insulating structure.

11. The solid electrolyte three-electrode electrochemical test device of claim 10, wherein the insulating structure comprises a second through hole, and the second through hole is coaxially located with the first through hole.

12. The solid electrolyte three-electrode electrochemical test device of claim 11, wherein the counter electrode and the second conductive structure are located in the second through hole and stacked with each other.

13. The solid electrolyte three-electrode electrochemical test device of claim 11, wherein the second conductive structure is located in the second through hole of the insulating structure, and the second conductive structure is in contact with a surface of the counter electrode away from the solid electrolyte layer.

14. The solid electrolyte three-electrode electrochemical test device of claim 1, wherein the counter electrode and the working electrode are located apart from each other and separated by the solid electrolyte layer, and the counter electrode and the working electrode are coaxially located with the solid electrolyte layer.

15. The solid electrolyte three-electrode electrochemical test device of claim 1, wherein the reference electrode is located between an inner wall of the groove and an outer wall of the insulating structure, and the reference electrode covers a part of the outer wall of the insulating structure.

* * * * *